(12) United States Patent
Komiyama

(10) Patent No.: US 7,102,120 B2
(45) Date of Patent: Sep. 5, 2006

(54) OPTICAL MODULE WITH BUILT-IN WAVELENGTH LOCKER

(75) Inventor: Manabu Komiyama, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 66 days.

(21) Appl. No.: 10/766,867

(22) Filed: Jan. 30, 2004

(65) Prior Publication Data
US 2005/0051712 A1 Mar. 10, 2005

(30) Foreign Application Priority Data
Sep. 5, 2003 (JP) ............... 2003-314699

(51) Int. Cl.
G02S 1/01 (2006.01)
H01J 40/14 (2006.01)
H01S 3/098 (2006.01)
H01S 3/10 (2006.01)
H01S 3/13 (2006.01)

(52) U.S. Cl. .................. 250/225; 372/32; 372/27; 372/18

(58) Field of Classification Search ............... 250/225, 250/226; 372/27, 19–21, 29.01, 29.02, 31, 372/32, 105, 106
See application file for complete search history.

(56) References Cited

U.S. PATENT DOCUMENTS 6,477,190 B1 11/2002 Komiyama et al. ........... 372/34
6,545,739 B1 4/2003 Matsumoto et al. ......... 349/198
6,584,129 B1* 6/2003 Hyuga et al. .................. 372/39
6,650,667 B1* 11/2003 Nasu et al. .................... 372/32
2003/0030881 A1* 2/2003 Xia et al. .................... 359/246
2003/0189711 A1* 10/2003 Orr et al. ..................... 356/484

FOREIGN PATENT DOCUMENTS

| JP | 04-196188 | 7/1992 |
| JP | 11-031859 | 2/1999 |
| JP | 11-119186 | 4/1999 |
| JP | 2001-291928 | 10/2001 |
| JP | 2003-185502 | 7/2003 |
| JP | 2000-323784 | 11/2003 |

* cited by examiner

Primary Examiner—Georgia Epps
Assistant Examiner—Brian Livedalen
(74) Attorney, Agent, or Firm—Bingham McCutchen LLP

(57) ABSTRACT

An optical module comprises a splitting element that splits light outputted from a light source; a first monitoring means that detects the intensity of light split by the splitting element; a polarization control means that switches the polarization state of light outputted from the splitting element based on a control signal; a filter means that accepts light outputted by the polarization control means as input, and whereof the characteristic changes depending on the polarization state of the input light; and a second monitoring means that detects the intensity of the light transmitted through the filter means.

6 Claims, 6 Drawing Sheets

OPTICAL MODULE WITH BUILT-IN WAVELENGTH LOCKER

CROSS-REFERENCE TO RELATED APPLICATIONS

This application is based upon and claims the benefit of priority from the prior Japanese Patent Application No. 2003-314699, filed Sep. 5, 2003, the entire contents of which are incorporated herein by reference.

BACKGROUND OF THE INVENTION

1. Field of the Invention

The present invention relates to optical modules equipped with a wavelength locker.

2. Description of Related Art

Wavelength division multiplexing (WDM) communication, which multiplexes light of different wavelengths to increase the transmission capacity, is used in optical transmission systems. WDM communication makes it possible to increase the transmission capacity per signal light wavelength band used by narrowing the signal light wavelength interval of multiplexed signal light. Currently, in WDM communication, 200 GHz, 100 GHz and 50 GHz signal light wavelength intervals have been put into practical use, and signal light wavelength intervals of 25 GHz and 12.5 GHz are sought in order to increase the transmission capacity.

In WDM communication, since multiple signal lights are transmitted with a specific signal light wavelength interval, it is necessary to have adequate isolation from signal light of adjacent wavelengths, and as the signal light wavelength interval becomes narrower, higher precision control of the output wavelength of the signal light source becomes necessary. In WDM communication systems, waveguide lockers are used, which inhibit wavelength fluctuation due to chronological fluctuation or fluctuation of surrounding temperature of the laser diode (LD) light source and lock the output light with high precision to a specific wavelength (for instance, Japanese Unexamined Patent Application Publication 2001-291928).

With the development of multiple wavelength WDM communication systems, from the viewpoint of convenience of system operation and inventory management, tunable LDs capable of outputting multiple WDM signal light wavelengths in a single unit have come to be used as the LD modules constituting the light source element. Etalon filters that allow adequate wavelength detection output to be obtained for multiple WDM signal light wavelengths and have wavelength periodicity are generally used in wavelength lockers of LD modules using tunable LDs.

FIG. 8 is an LD module having a wavelength locker function based on the prior art. LD module 3C, shown in top view in FIG. 8(a) and in side view in FIG. 8(b), comprises an LD element 10, LD carrier 11, forward first lens 12A, rearward lens 12B, beam splitter (BS) 30A, photodiodes (PDs) 20A and 20B, PD carriers 21A and 21B, etalon filter 31C, mount carrier 40, thermoelectric cooler (TEC) 41, optical isolator 50 and forward second lens 19, and is connected to optical fiber 60.

FIG. 9 is a plot of electrical current values, obtained by inputting LD output light into an etalon filter and monitoring the transmitted light with a PD, plotted against the change in LD output wavelength, and shows the transmittance characteristic of the etalon filter. An etalon filter is a filter that makes use of the fact that incoming light undergoes multiple interference by parallel plates or parallel membranes of interval L provided in a medium.

As shown in FIG. 9, the filter characteristics of an etalon filter are periodic, and its period of change (FSR: free spectral range) is expressed using the refractive index n of the medium, the interval L between the parallel plates or parallel membranes, and the constant c as:

$$FSR = c/2*n*L \qquad (1)$$

Namely, due to the periodicity of the transmittance characteristic of an etalon filter, if the input light intensity is the same, the monitor current values based on light with a wavelength shifted by an integer multiple of the FSR will be equal: for instance, in FIG. 9, for λ1, λ2, λ3 and λ4, each with a wavelength shifted by FSR, the difference in input wavelength cannot be distinguished based on the monitor current.

The filter characteristic and peak wavelength of an etalon filter shift depending on the angle of incidence of incident light. FIG. 10 shows the peak wavelength shift of an etalon filter due to changes in angle of incidence. If the angle of incidence of the input light signal entering an etalon filter is increased, the peak wavelength will shift to the shorter wavelength side, and the entire filter characteristics shown in FIG. 9 will shift to the shorter wavelength side as well.

In FIG. 8, the LD element 10 installed on LD carrier 11 outputs light forward (to the right in the figure) and rearward (to the left in the figure). The forward output light of LD element 10 is turned into parallel light by the forward first lens 12A, passes through optical isolator 50, is converged by the forward second lens 19, and is outputted to the optical fiber 60. The optical isolator 50 transmits light outputted by the forward first lens 12A and blocks light reflected by the second lens 19, thereby preventing output intensity fluctuation and output wavelength fluctuation of the LD element 10 due to reflected light.

Meanwhile, rearward output light is collimated by the rearward lens 12B and inputted into BS 30A. Rearward output light split by BS 30A is inputted into PD 20A mounted on PD carrier 21A to monitor the output light intensity. Rearward output light that has passed through BS 30A passes through etalon filter 31A and is inputted into PD 20B mounted on PD carrier 21B.

Thermoelectric cooler (TEC) 41 is an element that monitors the temperature of the LD element, for instance an element that adjusts the temperature of LD element 10 to keep it constant based on the results of monitoring by thermistor resistance or the like.

The monitored value of PD 20B is a value that reflects the output light intensity of LD element 10 and the transmittance characteristic of the etalon filter 31A, but by finding the quotient value by dividing the monitored value of PD 20B by the monitored value of PD 20A, the output fluctuations of LD element 10 are cancelled out, and an output intensity of the etalon filter 31A that corresponds to the output wavelength of LD element 10 can be obtained. That is, the quotient value obtained by dividing the monitored value of PD 20B by the monitored value of PD 20A has the characteristic shown in FIG. 9 in relation to the wavelength change of LD output light, regardless of the output light intensity of LD element 10, so changes in wavelength of the output light of LD element 10 can be detected based on changes in the quotient value.

As shown in FIG. 9, near the peak and near the bottom of the etalon filter transmission characteristic, the output of the etalon filter will not fluctuate much even if the input wavelength fluctuates, so minute changes in wavelength of the LD element cannot be detected based on the aforementioned quotient value. In LD modules having a wavelength lock function, in order to lock the output wavelength of the LD element with good precision, the sloped part of the characteristic is normally used, where the transmittance of the etalon filter varies greatly in response to wavelength fluctuation.

In order to monitor minute output wavelength fluctuations of an LD element, as shown in FIG. 10, the wavelength characteristic of the etalon filter is shifted by adjusting the angle of incidence, so as to make the target output wavelength of the LD element lie on the sloped part of the etalon filter characteristic.

The output light wavelength of the light source LD used in a WDM communication system is set up for each signal light wavelength interval of WDM communication systems, so the value used for FSR of the etalon used in the LD wavelength locker is the signal light wavelength interval when using either the left or right slope of the filter, and twice the signal light wavelength interval when using both the left and right slope of the filter.

As described above, with LD modules having a wavelength lock function, output wavelength changes of the LD element are detected based on monitor current changes due to the transmission characteristic of the etalon filter, controlling the output wavelength of the LD element 10 and fixing it at the target wavelength.

Since the transmission characteristic of the etalon filter used in the wavelength locker of FIG. 8 is periodic, light of a wavelength shifted by the FSR of the etalon filter cannot be distinguished based on the output transmitted by the etalon filter. That is, when wavelength locking is carried out based on a specific quotient value, there are multiple wavelength-lockable wavelengths of light.

Therefore, to achieve output of light of the target wavelength when the LD is started up, at the initial startup, it is necessary to first start up the wavelength locker in the vicinity of the lock wavelength (rough adjustment), and then perform wavelength locking based on the output of the wavelength locker unit, i.e. the monitored values of PD 20A and PD 20B (fine adjustment). Generally, the rough adjustment range of a wavelength locker using one etalon filter as shown FIG. 8 is at or below the FSR of the etalon filter.

Wavelength lockers are known that use multiple etalon filters in order to widen the rough adjustment range of the wavelength locker (e.g., Japanese Unexamined Patent Application Publication 2003-185502). FIG. 11 is a drawing that shows a conventional wavelength locker using multiple etalon filters, which has a configuration whereby light for monitoring the intensity of the output light of LD element 10 is split off by BS 30A, after that light for monitoring the light transmitted by etalon filter 31B used for rough adjustment is further split off by BS 30B, and the light transmitted by etalon filter 31A used for fine adjustment is monitored.

With the wavelength locker shown in FIG. 11, for instance by making the FSR of the etalon filter used for rough adjustment several times the signal light wavelength interval, fine adjustment of the output light wavelength of the LD element 10 can be performed over a broad range without going through a rough adjustment process at the time of initial startup.

With wavelength lockers using one etalon filter, in order to lock the output wavelength of the LD with good precision, it is necessary to use the sloped part of the characteristic where the transmittance of the etalon filter varies greatly in response to wavelength variation. While the filter characteristic of an etalon filter can be shifted by adjusting the etalon filter's slope angle, passive alignment performed while monitoring the passthrough output during assembly is essential for this, and the number of assembly processes increases.

Furthermore, as shown in FIG. 11, while it is possible to perform fine adjustment of the output wavelength of the LD over a broad range, without going through a rough adjustment process at initial startup, by using multiple etalon filters, for rough adjustment and for fine adjustment, this requires an additional etalon filter, BS and PD, and area is needed for installing the elements, so the overall volume of the LD module equipped with the wavelength locker increases. Furthermore, if an additional BS is used, the light splitting parts increase, so the number of assembly processes increases.

SUMMARY OF THE INVENTION

The present invention resolves the aforementioned problem. In one embodiment of the present invention, an optical module comprises a splitting element that splits light outputted from a light source; a first monitoring means that detects the intensity of light split by the splitting element; a polarization control means that switches the polarization state of light outputted from the splitting element based on a control signal; a filter means that accepts light outputted by the polarization control means as input, and whereof the characteristic changes depending on the polarization state of the input light; and a second monitoring means that detects the intensity of the light transmitted through the filter means.

In one aspect of the present invention, an output corresponding to the wavelength of the light source is obtained based on the results of detection by the first and second monitoring means is compared while switching the polarization control means, and the polarization control means is switched such that the output light of the polarization control means assumes a polarization state suitable for detecting wavelength fluctuation of the light source.

In one aspect of the present invention, the filter means is an etalon filter and is arranged such that the angle of incidence of input light entering the filter means varies depending on the polarization state of the input light.

In one aspect of the present invention, the filter means is an etalon filter consisting of birefringent crystal, and the direction of the optical axis of the birefringent crystal constituting the etalon filter is set such that the index of refraction for the input light entering the filter means will vary depending on the polarization state of the input light.

The optical module according to the present invention makes it possible, in an arrangement wherein the output light of a light source is inputted into a polarization control means and the output light of the polarization control means is inputted into a filter means whereof the transmittance characteristic varies depending on the polarization state, to detect minute wavelength changes over a broad wavelength range by switching the polarization state of the output light of the polarization control means.

For example, in the case of changing the output wavelength of a light source from a given WDM signal light wavelength to a different WDM signal light wavelength, or in the case of initial startup after power-on, the output light wavelength of the light source will not necessarily lie in a wavelength region where the filter means and monitoring means can detect minute wavelength changes, but with the optical module according to the present invention, by switching the polarization state of the polarization control means and comparing the output corresponding to the output light wavelength of the light source obtained by the first and second monitoring means, the polarization control means can be switched such that the output light wavelength of the light source will be in a wavelength region where the filter means and monitoring means will be able to detect minute wavelength changes, allowing minute wavelength changes to be detected over a broad wavelength range.

DETAILED DESCRIPTION OF THE INVENTION

Below, embodiment examples of the present invention are described with reference to the drawings.

Figure 1:
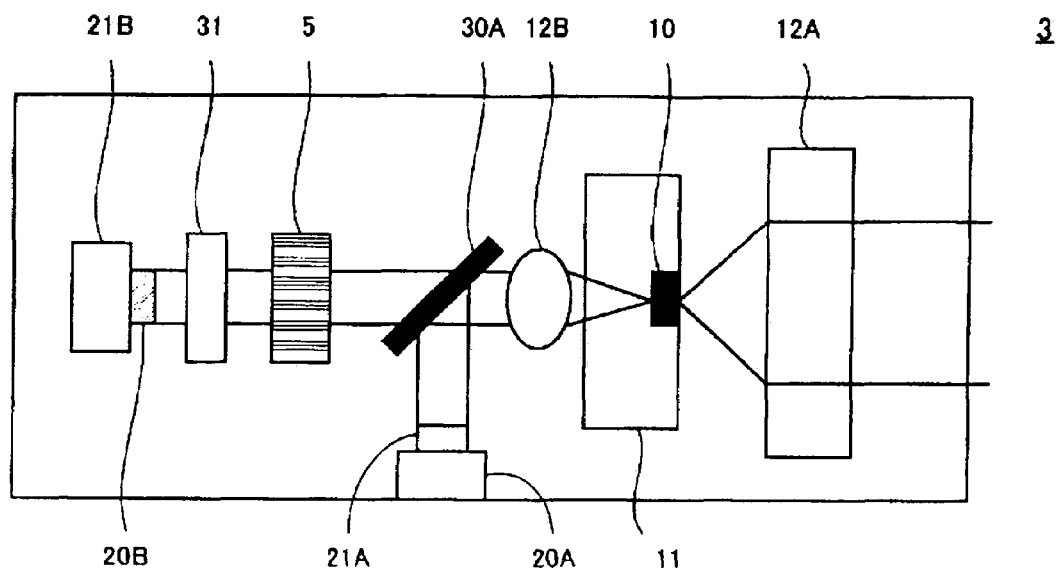
FIG. 1 is an exemplary drawing that shows the basic arrangement of the present invention

FIG. 1 shows the basic configuration of the present invention, wherein LD module 3 comprises an LD element 10 as the light source, an LD carrier 11, a forward first lens 12A, a rearward lens 12B, a beam splitter (BS) 30A as the splitting element, a polarization switching element 5, photodiodes (PD) 20A and 20B as the monitoring means, PD carriers 21A and 21B, filter 31A, mount carrier 40, thermo-electric cooler (TEC) 41, optical isolator 50 and forward second lens 19, and is connected to optical fiber 60.

With the LD module having a wavelength locker function based on the basic configuration of the present invention, rearward output light of the LD element 10 that has passed through BS 30A is switched to two different polarization states by means of the polarization switching element 5 controlled by external control signals, and the transmittance characteristic of the filter 31A is made changeable according to the polarization state, whereby fluctuations in the output wavelength of the LD element 10 are detected based on the results of monitoring by PD 20A and 20B.

Since the transmittance characteristic of the filter 31A is switched depending on the polarization state, comparing the output corresponding to the output wavelength of the LD element 10 based on the output of PD 20A and PD 20B and switching the polarization state of the polarization switching element 5 such that the transmittance characteristic of the filter 31A becomes suitable for detecting wavelength fluctuations of the output wavelength of the LD element 10 makes it possible to detect output wavelength fluctuations over a broad range.

For instance, when using a periodic filter as the filter 31A, for example if an etalon filter whereof the characteristic changes in a sine curve in relation to the wavelength is used, it is necessary to employ not the peak area or bottom area but the sloped area of the filter characteristic of the periodic filter in order to precisely detect the output wavelength fluctuation of the LD element 10.

Namely, in the sloped part of the wavelength characteristic of a periodic filter, the change in transmittance relative to the change in input wavelength is large, while in the peak area and bottom area of a periodic filter, the change in transmittance relative to change in input wavelength is small; moreover, the difference between two input wavelength whereby the transmittance in relation to the different input wavelength is the same is small. Thus, in order to detect wavelength fluctuation of light inputted into the filter with high precision, it is desirable to use the sloped part of the wavelength characteristic of the periodic filter.

The output light wavelength of the light source LD used in a WDM communication system is set up for each signal light wavelength interval of WDM communication systems, so when using an etalon used in an LD wavelength locker, the value used for the FSR of the etalon is the signal light wavelength interval when using either the left or right slope of the filter, and twice the signal light wavelength interval when using both the left and right slope of the filter. This way, when changing from a given WDM signal light wavelength to a different WDM signal light wavelength, if the wavelength before the change was at the slope of the filter, then the wavelength after the change will also be at the slope of the filter.

However, when the wavelength outputted by an LD module changes, for instance in the case of changing from a given WDM signal light wavelength to a different WDM signal light wavelength or in the case of initial startup after powering up the LD module, the output light wavelength of the LD element 10 will not necessarily be at the sloped part of the wavelength characteristic of the periodic filter.

Thus, when the output light wavelength of the LD element 10 is changed, it suffices to switch the polarization state of the polarization switching element 5 and compare the outputs corresponding to the output light wavelength of the LD element 10 obtained based on the results of monitoring by PD 20A and PD 20B, and on this basis switch the polarization switching element 5 such that the polarization state becomes suitable for detecting the wavelength fluctuation of the output light of the LD element 10.

For example, when using two periodic filters phase-shifted for multiple signal light wavelengths by switching between them, a characteristic value where the filter characteristics of the two periodic filters intersect exists both toward the peak area from the sloped part of the periodic filter and toward the bottom area from the sloped part. Taking these characteristic values as switching value 1 and switching value 2, if the filter characteristic value of the periodic filter corresponding to one polarization state is not a value between switching value 1 and switching value 2, then the filter characteristic value of the periodic filter corresponding to the other polarization state will be a value between switching value 1 and switching value 2. This way, the output wavelength of the LD element 10 will be at the sloped part of the filter characteristic, making it possible to detect output wavelength fluctuations of the LD element 10 with good precision.

Figure 2:
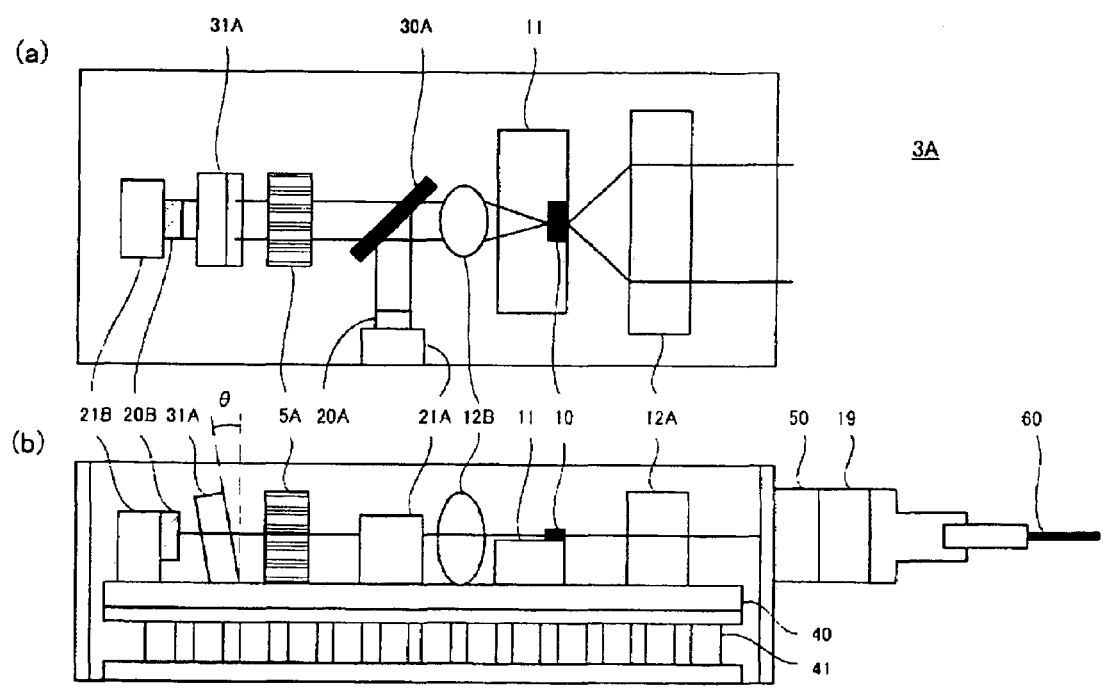
FIG. 2 is an exemplary drawing that shows an LD module having a wavelength locker function according to a first embodiment example

FIG. 2 shows an LD module having a wavelength locker function according to a first embodiment example of the present invention. LD module 3A, shown in top view in FIG. 2(a) and in side view in FIG. 2(b), comprises an LD element 10, an LD carrier 11, a forward first lens 12A, a rearward lens 12B, a beam splitter (BS) 30A, a liquid crystal 5A as the polarization switching element, photodiodes (PDs) 20A and 20B, PD carriers 21A and 21B, etalon filter 31A, mount carrier 40, thermoelectric cooler (TEC) 41, optical isolator 50 and forward second lens 19, and is connected to optical fiber 60.

In FIG. 2, it is assumed that LD output light with a direction of polarization horizontal to the platform 40A is horizontally polarized light, and LD output light with a direction of polarization vertical to the platform 40A is vertically polarized light. In the first embodiment example, LD element 10 is arranged such that rearward output light from LD element 10 will be horizontally polarized light. Furthermore, the etalon filter 31A is tilted by an amount θ in the vertical direction relative to the platform 40A, being arranged such that the angle of incidence of horizontally polarized light will be 0° and the angle of incidence of vertically polarized light will be θ.

The LD module having a wavelength locker function according to the first embodiment example is distinguished in that the etalon filter 31A is tilted only in the vertical direction relative to the platform, making the filter characteristic of the etalon filter 31A with respect to horizontally polarized light different from its filter characteristic with respect to vertically polarized light, and the plane of polarization of the light entering the etalon filter is changed by switching the liquid crystal 5A on and off.

Figure 3:
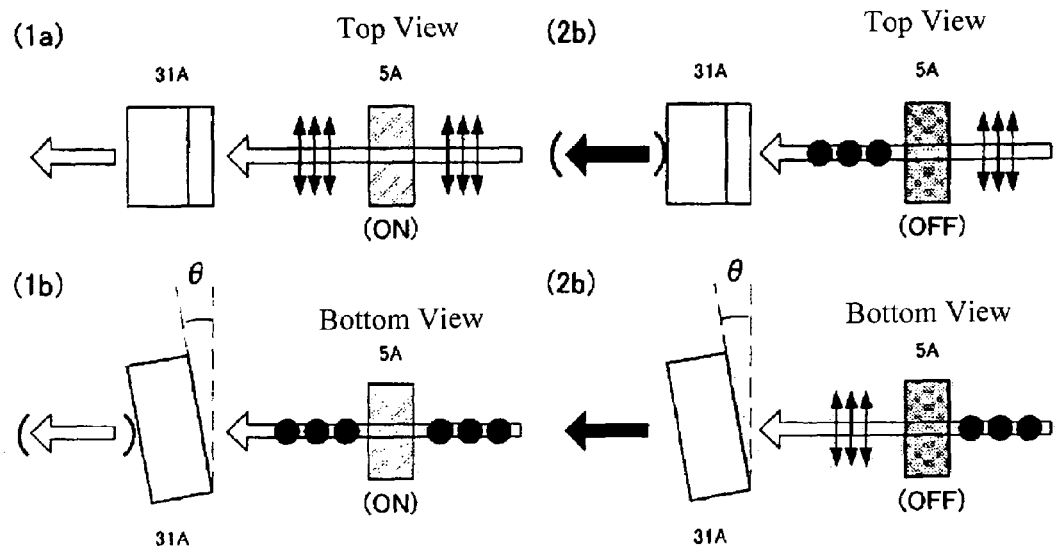
FIG. 3 is an exemplary drawing that shows the relationship between the on and off state of the liquid crystal and the etalon filter transmitted light in the first embodiment example

In FIG. 3(1a) through (2b), the relationship of the liquid crystal 5A, the etalon filter 31A and the rearward output light of the LD in the first embodiment example when the liquid crystal 5A is on and off is shown schematically in top view and side view. The rearward output light of LD element 10 entering the liquid crystal 5A is horizontally polarized light, so its plane of polarization is horizontal, shown by the arrows in the top view in FIG. 3(1a) and (2a).

Liquid crystal 5A is a liquid crystal whereby the plane of polarization of light transmitted through the liquid crystal 5A is changed by impressing voltage, with the plane of polarization of transmitted light when horizontally polarized light enters the liquid crystal 5A changing 90 degrees depending on whether the liquid crystal 5A is on or off. If a TN liquid crystal is used as the liquid crystal element, then when the liquid crystal 5A is on, the plane of polarization of horizontally polarized light inputted into the liquid crystal 5A will be maintained and it will be outputted as horizontally polarized light, as shown in FIG. 3(1a) and (1b). Moreover, when the liquid crystal 5A is off, the plane of polarization of horizontally polarized light inputted into the liquid crystal 5A will turn 90° and it will be outputted as vertically polarized light, as shown in FIG. 3(2a) and (2b).

Next, the operation of the LD module having a wavelength locker function according to the first embodiment example is described.

In FIG. 2, the LD element 10 installed on LD carrier 11 outputs light forward (to the right in the figure) and rearward (to the left in the figure). The forward output light of LD element 10 is turned into parallel light by the forward first lens 12A, passes through optical isolator 50, is converged by the forward second lens 19, and is outputted to the optical fiber 60. The optical isolator 50 transmits light outputted by the forward first lens 12A and blocks light reflected by the second lens 19, thereby preventing reflected light from returning to the LD element 10.

Meanwhile, rearward output light is collimated by the rearward lens 12B and inputted into BS 30A. Rearward output light split by BS 30A is inputted into PD 20A mounted on PD carrier 21A to monitor the output light intensity. Rearward output light that has passed through BS 30A is inputted into the liquid crystal 5A.

Thermoelectric cooler (TEC) 41 is an element that monitors the temperature of the LD element, for instance changing the temperature base on the results of monitoring by thermistor resistance or the like so as to keep the temperature of LD element 10 constant.

When the liquid crystal 5A is on, as shown in FIG. 3(1a) and (1b), light that exits the liquid crystal 5A and enters the etalon filter 31A is horizontally polarized light, so its angle of incidence on the etalon filter 31A is 0°, and it is filtered and outputted based on the characteristic of the etalon filter 31A when the angle of incidence is 0°.

On the other hand, when liquid crystal 5A is off, as shown in FIG. 3(2a) and (2b), light that exits the liquid crystal 5A and enters the etalon filter 31A is vertically polarized light, so its angle of incidence on the etalon filter 31A is θ, and it is filtered and outputted based on the characteristic of the etalon filter 31A when the angle of incidence is θ.

Light transmitted by the etalon filter 31A enters PD 20B mounted on PD carrier 21B.

The monitored value of PD 20B is a value that reflects the output light intensity of LD element 10 and the transmittance characteristic of the etalon filter 31A, but by finding the quotient value by dividing the monitored value of PD 20B by the monitored value of PD 20A, the output fluctuations of LD element 10 are cancelled out, and an output intensity of the etalon filter 31A that corresponds to the output wavelength of LD element 10 can be obtained, making it possible to detect fluctuations in the output light wavelength.

Furthermore, since the transmittance characteristic of the etalon filter 31A is changed by electrically switching the liquid crystal on and off by means of an external control signal, it is possible to detect output light wavelength fluctuations by means of two types of etalon filters.

In WDM communication, when the signal light wavelength interval is 100 GHz, an etalon with an FSR of 0.8 nm is used as the wavelength lock (fine adjustment) etalon. As described above, in wavelength lockers, to precisely lock the output wavelength of the LD, the sloped part of the characteristic, where the transmittance of the etalon filter varies greatly, is employed, while the vicinity of the peak and the bottom of the etalon filter characteristic cannot be used.

If two filters are used with equal FSRs and with peak wavelengths shifted by ¼ the FSR, then when the LD output wavelength is in the vicinity of the peak or bottom of one of the filters, it will be at the sloped part of the other filter, so by switching the filter used by switching the liquid crystal, the lockable wavelength range of LD output wavelengths will not be subject to restrictions. In the first embodiment example, a ¼ FSR peak wavelength shift, for instance a 0.2 nm peak wavelength shift when the signal light wavelength interval is 100 GHz, is achieved by making the angle of incidence θ of vertically polarized light approximately 1.5°.

Figure 4:
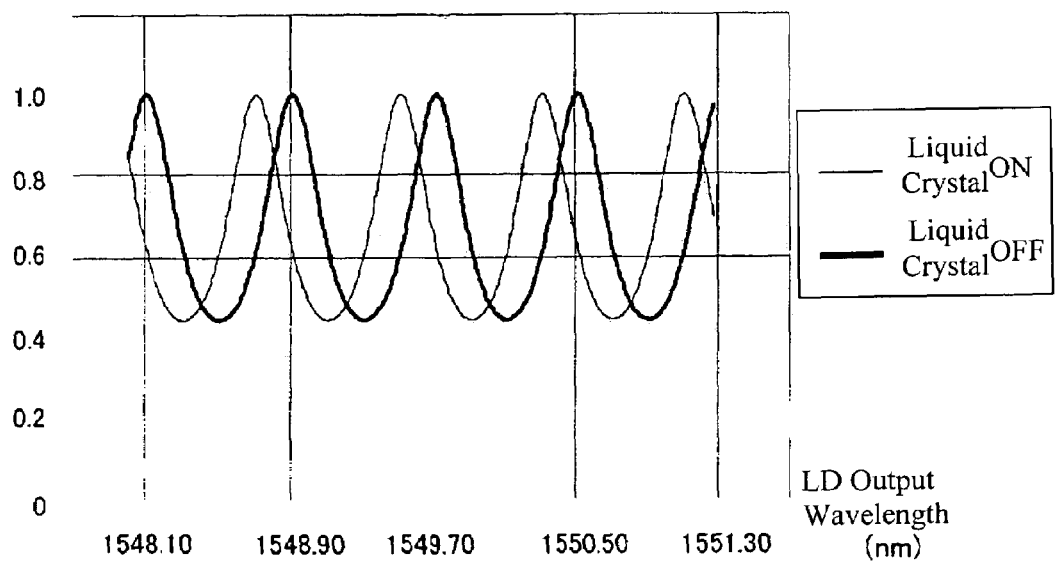
FIG. 4 is an exemplary drawing that shows the relationship between the on and off state of the liquid crystal and the wavelength detection unit output in the first embodiment example

FIG. 4 plots the quotient value obtained by dividing the monitored value of PD 20B by the monitored value of PD 20A against wavelength when the liquid crystal is on and when the liquid crystal is off. The thick line signifies the quotient value when the liquid crystal is on, i.e. when horizontally polarized light is inputted into the etalon filter 31A, as shown in FIG. 3(1a) and (1b), while the thin line signifies the quotient value when the liquid crystal is off, i.e. when vertically polarized light is inputted into the etalon filter 31A, as shown in FIG. 3(2a) and (2b).

By making the angle of incidence of horizontally polarized light 0° and the angle of incidence of vertically polarized light approximately 1.5°, and shifting the peak wavelength by 0.2 nm, which is ¼ of the FSR, when the quotient value with the liquid crystal on is near the peak or bottom, the quotient value with the liquid crystal off will lie at the sloped part, making-it possible to detect fine changes in output wavelength of the LD based on the quotient value with the liquid crystal either on or off, allowing locking over a wide wavelength range.

With the LD module having a wavelength locker function according to the first embodiment example as described above, by setting the slope angle of the etalon filter 31A in accordance with the signal light wavelength interval, fine changes in LD wavelength can be detected at any wavelength, making it possible to perform wavelength locking at any wavelength.

Next, a second embodiment example of the present invention is described.

Figure 5:
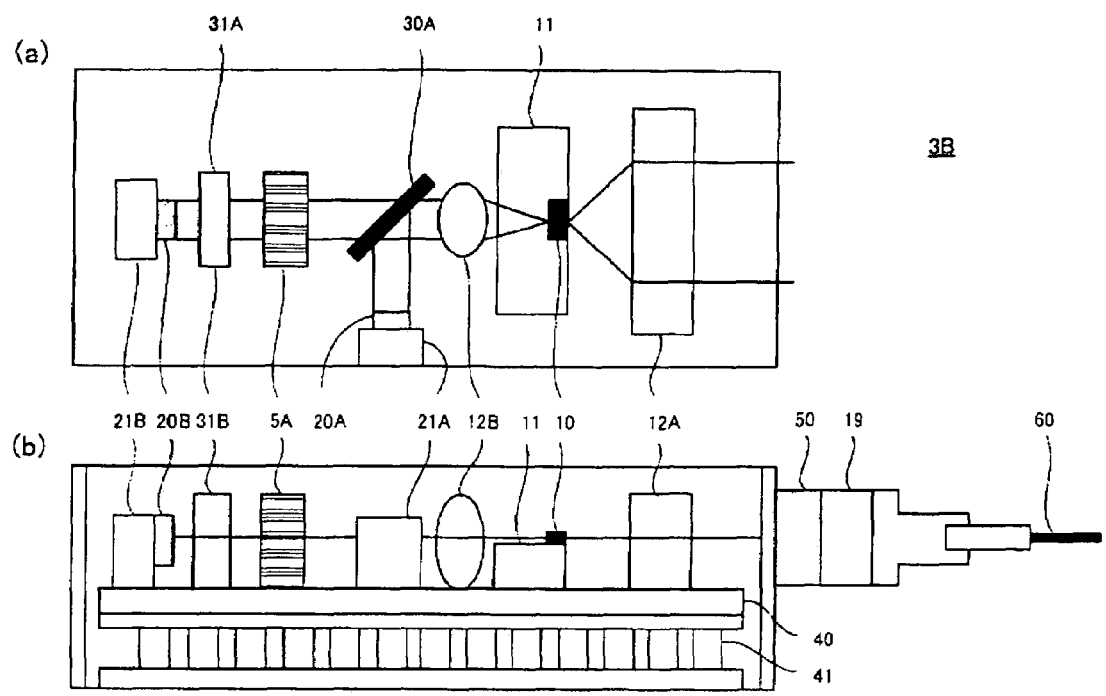
FIG. 5 is an exemplary drawing that shows an LD module having a wavelength locker function according to a second embodiment example

FIG. 5 shows an LD module having a wavelength locker function according to a second embodiment example of the present invention. The LD module 3B, shown in top view in FIG. 5(a) and in side view in FIG. 5(b), comprises LD element 10, LD carrier 11, forward first lens 12A, rearward lens 12B, BS 30A, liquid crystal 5A as a polarization switching element, PDs 20A and 20B, PD carriers 21A and 21B, etalon filter 31B, mount carrier 40, TEC 41, optical isolator 50 and forward second lens 19, and is connected to optical fiber 60.

Just as in the first embodiment example, in FIG. 5, it is assumed that LD output light with a direction of polarization horizontal to the platform 40A is horizontally polarized light, and LD output light with a direction of polarization vertical to the platform 40A is vertically polarized light. In the second embodiment example as well, the LD element 10 is arranged such that rearward output light from the LD element 10 will be horizontally polarized light.

Etalon filter 31B is a filter consisting of birefringent crystal. Since the filter characteristic of the etalon filter varies according to the refractive index n of the medium and the interval L of the parallel plates or parallel membranes, by designing the optical axis such that the refractive index of the medium is different for horizontally polarized light and vertically polarized light, an etalon filter can be obtained whereof the filter characteristic for horizontally polarized light and the filter characteristic for vertically polarized light are different. In the second embodiment example, the etalon filter is designed such that the birefringence index of filter medium for horizontally polarized light is no and the birefringence index of the filter medium for vertically polarized light is $n_e$.

The LD module having a wavelength locker function according to the second embodiment example is distinguished in that it allows the plane of polarization of light entering the etalon filter to be changed by turning the liquid crystal 5A on and off, by using birefringent crystal as the medium of etalon filter 31B and selecting the optical axis of the medium such that the refractive index of the etalon filter 31B for horizontally polarized light and the refractive index for vertically polarized light are different.

Figure 6:
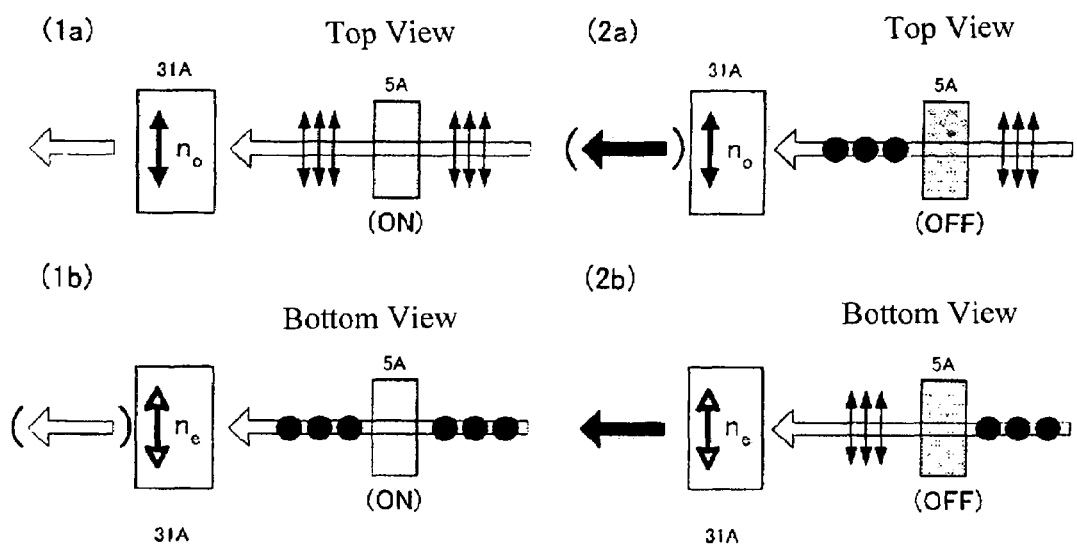
FIG. 6 is an exemplary drawing that shows the relationship between the on and off state of the liquid crystal and the etalon filter transmitted light in the second embodiment example

In FIG. 6(1a) through (2b), the relationship of the liquid crystal 5A, the etalon filter 31B and the rearward output light of the LD in the second embodiment example when the liquid crystal 5A is on and off is shown schematically in top view and side view. The rearward output light of LD element 10 entering the liquid crystal 5A is horizontally polarized light, so its plane of polarization is horizontal, shown by the arrows in the top view in FIG. 6(1a) and (2a).

Just as in embodiment example 1, liquid crystal 5A is a liquid crystal whereby the plane of polarization of light transmitted through the liquid crystal 5A is changed by impressing voltage, with the plane of polarization of transmitted light when horizontally polarized light enters in the liquid crystal 5A changing 90 degrees depending on whether the liquid crystal 5A is on or off. If a TN liquid crystal is used as the liquid crystal element, then when the liquid crystal SA is on, the plane of polarization of horizontally polarized light inputted into the liquid crystal 5A will be maintained and it will be outputted as horizontally polarized light, as shown in FIG. 6(1a) and (1b). Moreover, when the liquid crystal 5A is off, the plane of polarization of horizontally polarized light inputted into the liquid crystal 5A will turn 90° and it will be outputted as vertically polarized light, as shown in FIG. 6(2a) and (2b).

Next, the operation of the LD module having a wavelength locker function according to the second embodiment example is described.

In FIG. 5, the LD element 10 installed on LD carrier 11 outputs light forward (to the right in the figure) and rearward (to the left in the figure). The forward output light of LD element 10 is turned into parallel light by the forward first lens 12A, passes through optical isolator 50, is converged by the forward second lens 19, and is outputted to the optical fiber 60. The optical isolator 50 transmits light outputted by the forward first lens 12A and blocks light reflected by the second lens 19, thereby preventing reflected light from returning to the LD element 10.

Meanwhile, rearward output light is collimated by the rearward lens 12B and inputted into BS 30A. Rearward output light split by BS 30A is inputted into PD 20A mounted on PD carrier 21A to monitor the output light intensity. Rearward output light that has passed through BS 30A is inputted into the liquid crystal 5A.

When the liquid crystal 5A is on, as shown in FIG. 6(1a) and (1b), light that exits the liquid crystal 5A and enters the etalon filter 31B is horizontally polarized light, so it is filtered and outputted based on the characteristic of the etalon filter 31B with refractive index no.

On the other hand, when liquid crystal 5A is off, as shown in FIG. 6(2a) and (2b), light that exits the liquid crystal 5A and enters the etalon filter 31B is vertically polarized light, so it is filtered and outputted based on the characteristic of the etalon filter 31B with refractive index $n_o$.

Light transmitted by the etalon filter 31A enters PD 20B mounted on PD carrier 21B.

The monitored value of PD 20B is a value that reflects the output light intensity of LD element 10 and the transmittance characteristic of the etalon filter 31A, but by finding the quotient value by dividing the monitored value of PD 20B by the monitored value of PD 20A, the output fluctuations of LD element 10 are cancelled out, and an output intensity of the etalon filter 31A that corresponds to the output wavelength of LD element 10 can be obtained, making it possible find the output light wavelength.

Furthermore, since the transmittance characteristic of the etalon filter 31B is changed by electrically switching the liquid crystal on and off by means of an external control signal, it is possible to find the output light wavelength by means of two types of etalon filters.

In WDM communication, when the signal light wavelength interval is 100 GHz, an etalon with an FSR of 0.8 nm is used as the wavelength lock (fine adjustment) etalon. As described above, in wavelength lockers, to precisely lock the output wavelength of the LD, the sloped part of the characteristic, where the transmittance of the etalon filter varies greatly, is employed, while the vicinity of the peak and the bottom of the etalon filter characteristic cannot be used.

If two filters are used with equal FSRs and with peak wavelengths shifted by ¼ the FSR, then when the LD output wavelength is in the vicinity of the peak or bottom of one of the filters, it will be at the sloped part of the other filter, so the lockable wavelength range of LD output wavelengths is not subject to restrictions. In the second embodiment example, a ¼ FSR peak wavelength shift, for instance a 0.2 nm peak wavelength shift when the signal light wavelength interval is 100 GHz, is achieved by using birefringent crystal as the medium of the etalon filter 31B.

As described above, in formula (1), the FSR of an etalon filter is expressed based on the refractive index n of the medium and the gap L of the parallel plates or parallel membranes as FSR=c/2*n*L, and changes depending on the refractive index n of the medium. As the birefringence index of the medium (the refractive index difference) becomes larger, the FSR difference between horizontally polarized light and vertically polarized light becomes bigger, restricting the wavelength range in that wavelength fluctuations can be detected by the sloped part of the filter using either of the two filters with peak wavelength shifted by ¼ of the FSR. Therefore, as the birefringent medium of the etalon filter 31B used in embodiment example 2, it is necessary to select birefringent crystals with a birefringence index large enough to generate a peak wavelength shift and small enough so that restrictions on the wavelength range that can be finely adjusted based on the FSR difference do not become a problem.

Figure 7:
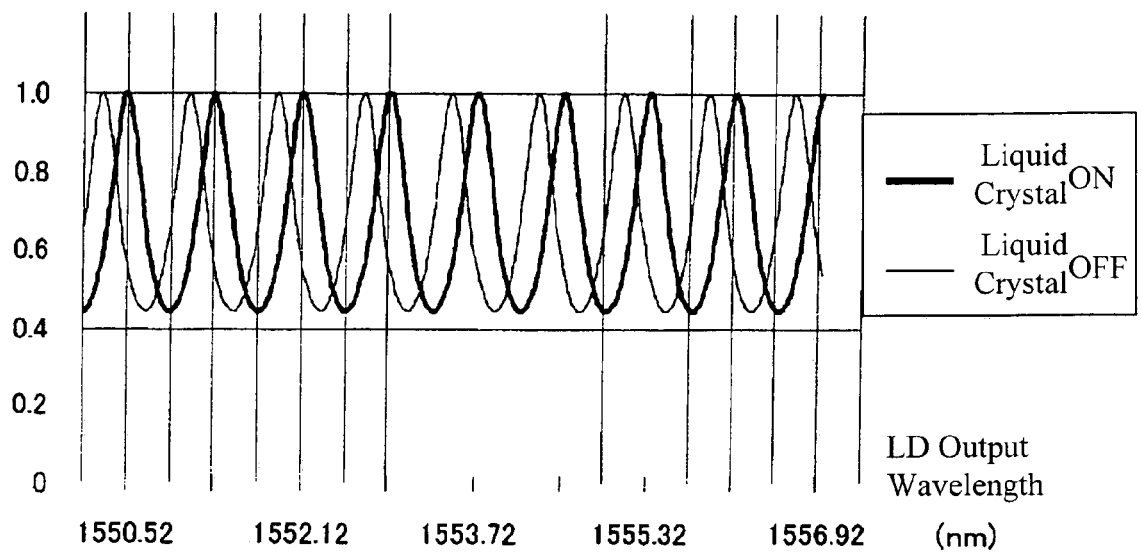
FIG. 7 is an exemplary drawing that shows the relationship between the on and off state of the liquid crystal and the wavelength detection unit output in the first embodiment example
Figure 8:
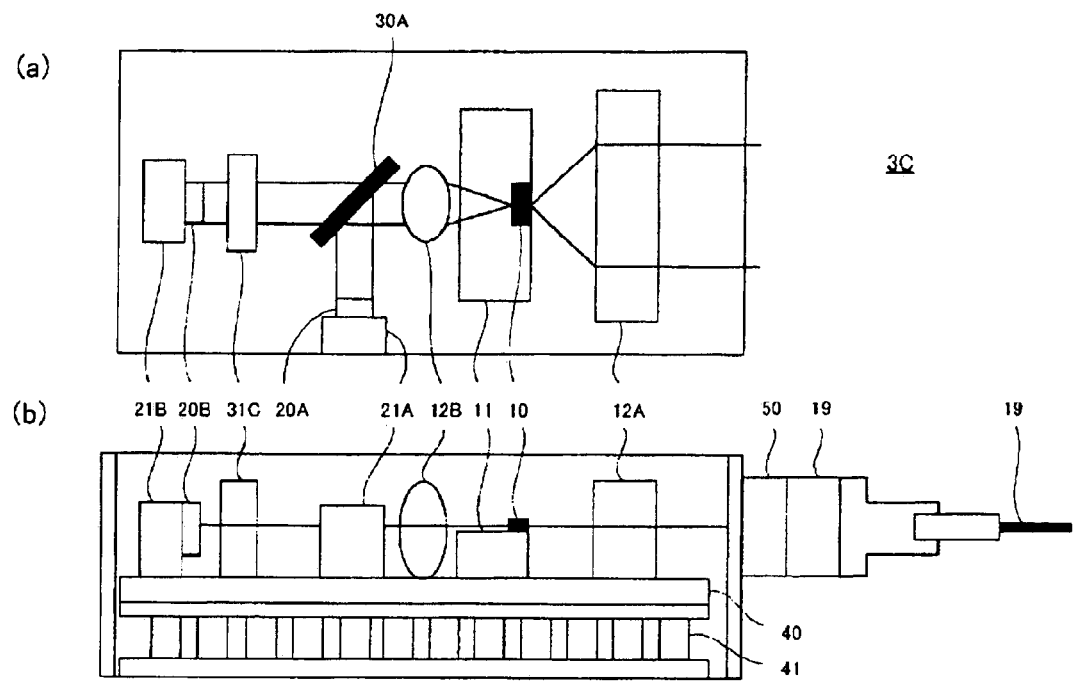
FIG. 8 is an exemplary drawing that shows an LD module having a wavelength locker function according to the prior art
Figure 9:
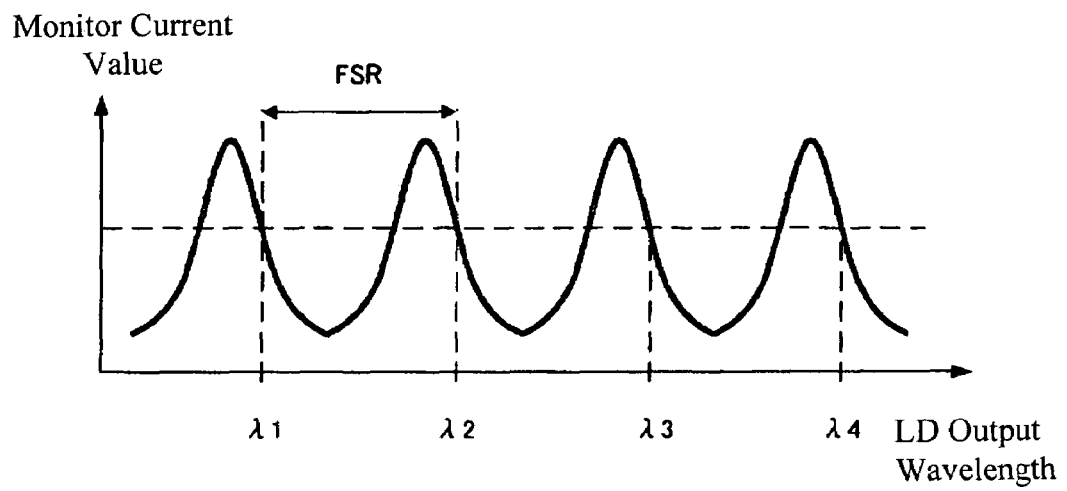
FIG. 9 is an exemplary drawing that shows the transmittance characteristic of an etalon filter in relation to input light wavelength
Figure 10:
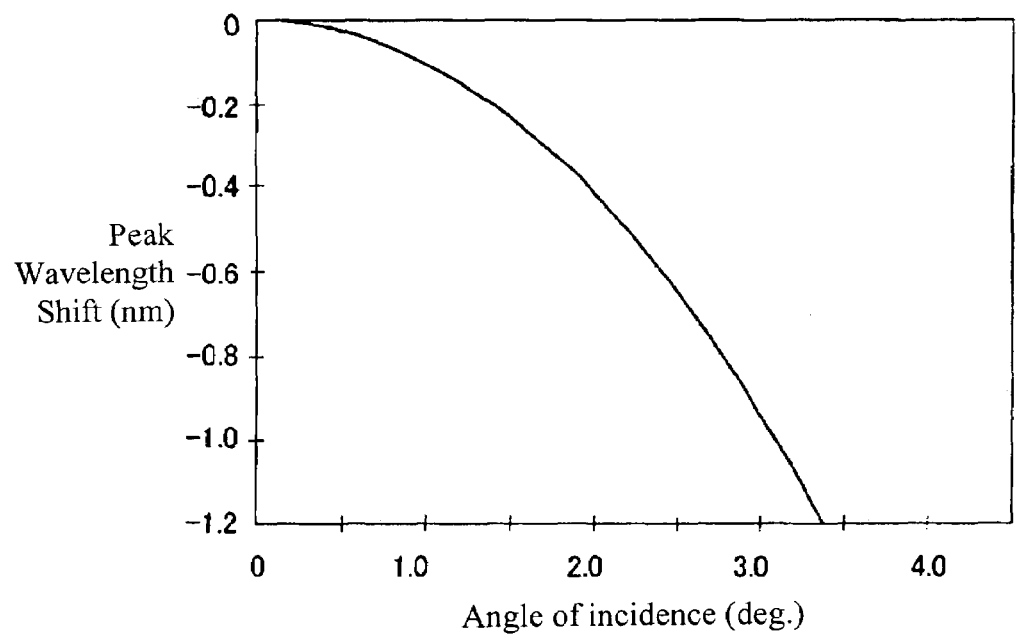
FIG. 10 is an exemplary drawing that shows the amount of shift of the filter characteristic peak wavelength depending on the angle of incidence
Figure 11:
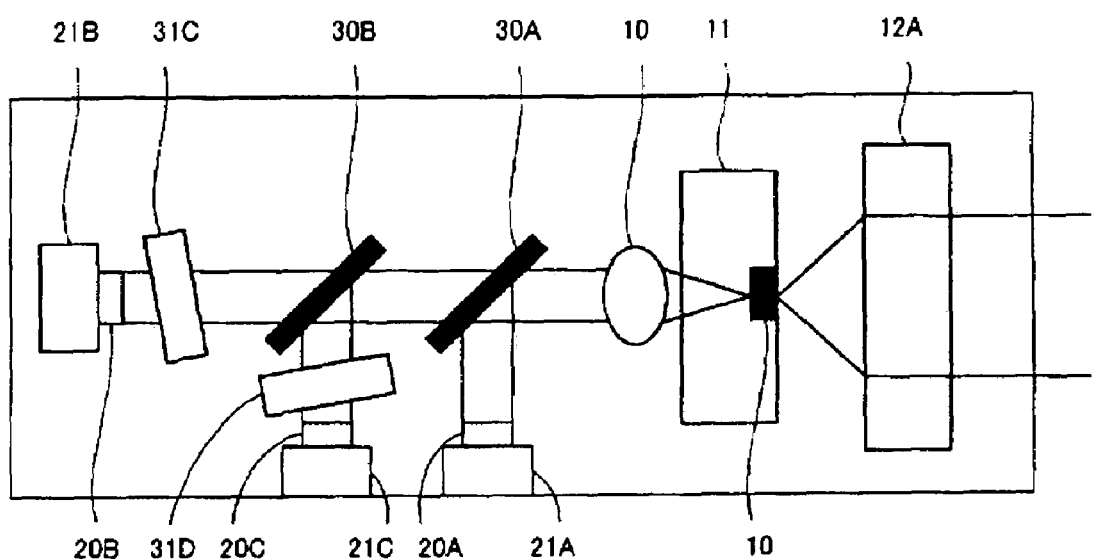
FIG. 11 is an exemplary drawing that shows an LD module having a wavelength locker function using multiple etalon filters according to the prior art.

A plot of the quotient value obtained by dividing the monitored value of PD 20B by the monitored value of PD 20A against the wavelength with the liquid crystal on and off, using a rock crystal as the birefringent crystal of etalon filter 31B, is shown in FIG. 7. The thick line signifies the quotient value when the liquid crystal is on, i.e. when horizontally polarized light is inputted into the etalon filter 31B, as shown in FIG. 6(1a) and (1b), while the thin line signifies the quotient value when the liquid crystal is off, i.e. when vertically polarized light is inputted into the etalon filter 31B, as shown in FIG. 8(2a) and (2b).

The rock crystal is a birefringent crystal with characteristics of ordinary refractive index no=1.5272 and extraordinary refractive index $n_e$=1.5357, and by designing the optical axis of the rock crystal, which is the birefringent crystal of the medium, such that the refractive index for light inputted into the etalon filter 31B will be no for horizontally polarized light and $n_e$ for vertically polarized light, two filter characteristics with shifted peak wavelengths are obtained, as shown in FIG. 7. The difference between the ordinary refractive index and extraordinary refractive index of the rock crystal is about 0.6% of the ordinary refractive index, so the FSR difference between horizontally polarized light and vertically polarized light will not be a quantity that restricts the finely adjustable wavelength range of the LD.

In the graph of FIG. 7, when the quotient value with the liquid crystal on is in the vicinity of the peak or bottom, the quotient value with the liquid crystal off will be at the sloped part, so minute changes in output wavelength of the LD can be detected based on the quotient value with the liquid crystal either on or off, allowing locking over a wide wavelength range.

With the LD module having a wavelength locker function according to the second embodiment example as described above, by selecting the material of the birefringent crystal of etalon filter 31B in accordance with the signal light wavelength interval and adjusting the optical axis, it is possible to detect minute changes in the LD wavelength at any wavelength, allowing wavelength locking to be performed at any wavelength.

In the first and second embodiment examples described above, the filter characteristic of the etalon filter switched by turning the liquid crystal on and off was made into two filters with the peak wavelength shifted by ¼ of the FSR, so that when one of the filters is in the vicinity of the peak or bottom, the LD output wavelength will be at the sloped part of the other filter. This makes it possible to detect minute wavelength changes over a wide wavelength range, but the filter characteristic of the etalon filter switched by turning the liquid crystal on and off in the LD module having a wavelength locker function according to the present invention is not limited to a characteristic shifted by ¼ of the FSR as described above.

For example, by varying the shift amount from ¼ of the FSR, the level difference when the liquid crystal is switched on and off will take on different values depending on the input wavelength, which can be made use of to detect the input wavelength.

Furthermore, in cases where the filter characteristic of an etalon filter employing birefringent crystal is switched by turning the liquid crystal on and off, by selecting a birefringent crystal such that the FSR will take on highly different values with the two filters, the level difference when the liquid crystal is switched on and off will take on different values depending on the input wavelength, which can be made use of to detect the input wavelength.

Furthermore, while in the above embodiment examples, wavelength fluctuation was detected using rearward output light of the LD element 10, one may also split the forward output light and perform intensity monitoring and etalon filter transmitted light monitoring to detect wavelength fluctuation.

We claim:

1. An optical module comprising:
   a splitting element operable to split light outputted from a light source;
   a first monitoring device operable to detect an intensity of the light split by the splitting element;
   a polarization control device operable to switch a polarization state of light outputted from the splitting element in response to a control signal;
   a filter device operable to receive light outputted by the polarization control device, wherein a transmittance characteristic of the filter device changes depending on the polarization state of the input light; and a second monitoring device operable to detect an intensity of light transmitted through the filter device;

wherein a wavelength fluctuation of the light source is detected based on intensity of light detected by the first or second monitoring devices.

2. An optical module as set forth in claim 1, wherein the filter device comprises an etalon filter which is arranged such that an angle of incidence of input light entering the filter device varies depending on the polarization state of the input light.

3. An optical module as set forth in claim 1, wherein the filter device comprises an etalon filter including birefringent crystal, and a direction of an optical axis of the birefringent crystal is set such that an index of refraction for the input light entering the filter devices varies depending on the polarization state of the input light.

4. An optical module as set forth in claim 1, further comprising:

a comparing device operable to compare outputs corresponding to a wavelength of the light source obtained based on intensity of light detected by the first or second monitoring devices, the comparison occurring while switching the polarization control device; and wherein the polarization control device is switched such that the output light of the polarization control means assumes a polarization state suitable for detecting wavelength fluctuation of the light source.

5. An optical module as set forth in claim 4, wherein the filter device comprises an etalon filter which is arranged such that an angle of incidence of input light entering the filter device varies depending on the polarization state of the input light.

6. An optical module as set forth in claim 4, wherein the filter device comprises an etalon filter including birefringent crystal, and a direction of an optical axis of the birefringent crystal is set such that an index of refraction for the input light entering the filter devices varies depending on the polarization state of the input light.

* * * * *